US009254993B2

(12) United States Patent
Oppermann

(10) Patent No.: US 9,254,993 B2
(45) Date of Patent: Feb. 9, 2016

(54) METHOD FOR CONNECTING A PRECIOUS METAL SURFACE TO A POLYMER

(75) Inventor: Hermann Oppermann, Berlin (DE)

(73) Assignee: Fraunhofer-Gesellschaft zur Förderung der angewandten Forschung e. V. (DE)

( * ) Notice: Subject to any disclaimer, the term of this patent is extended or adjusted under 35 U.S.C. 154(b) by 992 days.

(21) Appl. No.: 12/742,179

(22) PCT Filed: Nov. 14, 2008

(86) PCT No.: PCT/EP2008/009829
§ 371 (c)(1),
(2), (4) Date: Aug. 19, 2010

(87) PCT Pub. No.: WO2009/062753
PCT Pub. Date: May 22, 2009

(65) Prior Publication Data
US 2010/0307804 A1 Dec. 9, 2010

(30) Foreign Application Priority Data
Nov. 14, 2007 (DE) .......................... 10 2007 055 018

(51) Int. Cl.
B81B 7/00 (2006.01)
H05K 3/00 (2006.01)
(Continued)

(52) U.S. Cl.
CPC ................ *B81B 7/0006* (2013.01); *C22C 1/02* (2013.01); *C22C 1/08* (2013.01); *H01L 24/28* (2013.01); *H05K 3/24* (2013.01); *H05K 3/383* (2013.01); *H01L 2924/01004* (2013.01); *H01L 2924/01005* (2013.01); *H01L 2924/01015* (2013.01); *H01L 2924/01024* (2013.01); *H01L 2924/01029* (2013.01); *H01L 2924/0132* (2013.01); *H01L 2924/01032* (2013.01); *H01L 2924/01033* (2013.01); *H01L 2924/01047* (2013.01); *H01L 2924/01074* (2013.01); *H01L 2924/01078* (2013.01); *H01L 2924/01079* (2013.01); *H01L 2924/01082* (2013.01);
(Continued)

(58) Field of Classification Search
None
See application file for complete search history.

(56) References Cited

U.S. PATENT DOCUMENTS 3,097,149 A * 7/1963 Hassler et al. ................ 205/656
3,597,524 A * 8/1971 Schreiner et al. ............... 174/42
(Continued)

FOREIGN PATENT DOCUMENTS

EP 0392738 A1 10/1990
JP 9153519 A 6/1997
(Continued)

OTHER PUBLICATIONS

"International Application Serial No. PCT/EP2008/009829, English Translation of International Preliminary Report on Patentability issued Jun. 1, 2010", 6 pgs.
(Continued)

Primary Examiner — Dah-Wei D Yuan
Assistant Examiner — Jose Hernandez-Diaz
(74) Attorney, Agent, or Firm — Schwegman Lundberg & Woessner, P.A.

(57) ABSTRACT

The invention relates to a method for connecting a precious metal surface to a polymer, wherein a layer made of 20% to 40% gold and 60% to 80% silver is deposited on a substrate and the silver is subsequently selectively removed in order to produce a nanoporous gold layer. A fluid polymer is applied to the gold layer and cured.

28 Claims, 1 Drawing Sheet

(51) Int. Cl.
*C22C 1/02* (2006.01)
*C22C 1/08* (2006.01)
*H01L 23/00* (2006.01)
*H05K 3/24* (2006.01)
*H05K 3/38* (2006.01)
*H05K 3/28* (2006.01)

(52) U.S. Cl.
CPC ........ *H01L 2924/09701* (2013.01); *H05K 3/28* (2013.01); *H05K 2201/0116* (2013.01); *H05K 2203/0361* (2013.01)

(56) References Cited

U.S. PATENT DOCUMENTS

| | | | |
|---|---|---|---|
| 4,977,038 A * | 12/1990 | Sieradzki et al. | 428/610 |
| 2002/0127327 A1* | 9/2002 | Schwarz et al. | 427/2.15 |
| 2004/0040416 A1 | 3/2004 | Erlebacher et al. | |
| 2004/0148015 A1 | 7/2004 | Lye et al. | |
| 2006/0193890 A1* | 8/2006 | Owens et al. | 424/423 |
| 2006/0274470 A1* | 12/2006 | Srinivasan et al. | 361/103 |
| 2007/0048514 A1* | 3/2007 | Rockford | 428/316.6 |
| 2007/0224099 A1 | 9/2007 | Biener et al. | |
| 2007/0275503 A1* | 11/2007 | Lin et al. | 438/106 |
| 2010/0323518 A1 | 12/2010 | Oppermann et al. | |

FOREIGN PATENT DOCUMENTS

| | | |
|---|---|---|
| JP | 2007/277613 A | 10/2007 |
| WO | WO-2004/020064 A2 | 3/2004 |

OTHER PUBLICATIONS

"U.S. Appl. No. 12/743,009, Non Final Office Action mailed Jan. 10, 2013", 8 pgs.

"International Application No. PCT/EP2008/009829, International Search Report and Written Opinion mailed Feb. 3, 2009", 11 pgs.

"International Application No. PCT/EP2008/009830, International Search Report and Written Opinion mailed Jan. 20, 2009", 12 pgs.

"International Application Serial No. PCT/EP2008/009829, International Preliminary Report on Patentability mailed May 27, 2010", 8 pgs.

Cattarin, S., et al., "Preparation and Characterization of Gold Nanostructures of Controlled Dimension by Electrochemical Techniques", *J. Phys. Chem. C*, 111(34), (2007), 12643-12649.

Erlebacher, J., et al., "Evolution of nanoporosity in dealloying.", *Nature*, 410(6827), (Mar. 22, 2001), 450-3.

Lu, X., et al., "Dealloying of Au—Ag thin films with a composition gradient: Influence on morphology of nanoporous Au", *Thin Solid Films*, 515(18), (Jun. 25, 2007), 7122-7126.

"Application No. 2007-852958, Database WPI Week 200779, Thomson Scientific, London, GB", XP-002509516, as cited in PCT Search Report dated Feb. 3, 2009, (Jan. 28, 2009), 2 pgs.

"U.S. Appl. No. 12/743,009, Corrected Notice of Allowance mailed Oct. 16, 2013", 2 pgs.

"U.S. Appl. No. 12/743,009, Notice of Allowance mailed Jul. 22, 2013", 8 pgs.

"U.S. Appl. No. 12/743,009, Response filed Apr. 8, 2013 to Non Final Office Action mailed Jan. 10, 2013", 9 pgs.

* cited by examiner

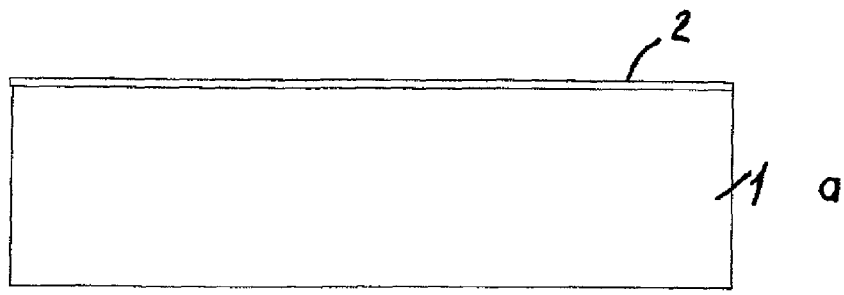
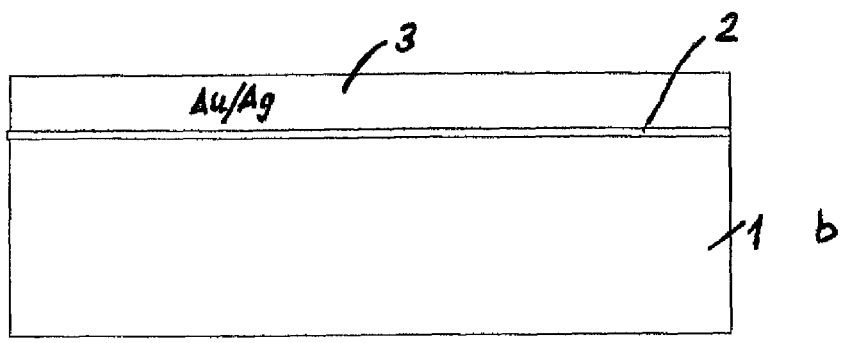
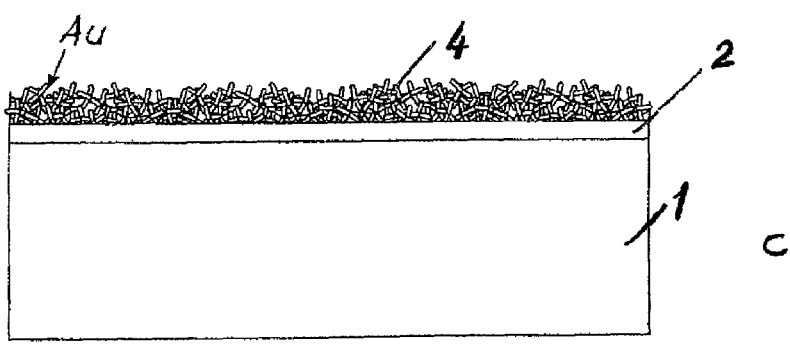
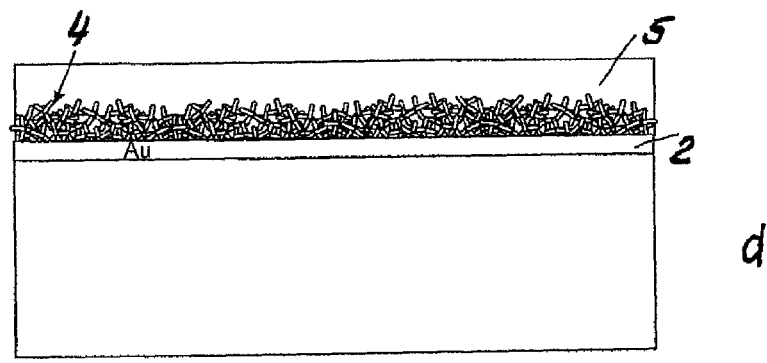

US 9,254,993 B2

METHOD FOR CONNECTING A PRECIOUS METAL SURFACE TO A POLYMER

PRIORITY CLAIM TO RELATED APPLICATIONS

This application is a national stage application under 35 U.S.C. §371 of PCT/EP2008/009829, filed Nov. 14, 2008, and published as WO 2009/062753 A1 on May 22, 2009, which claims priority to German Application No. 10 2007 055 018.0, filed Nov. 14, 2007, which applications and publication are incorporated herein by reference and made a part hereof in their entirety, and the benefit of priority of each of which is claimed herein.

By way of example, but not by way of limitation, the invention relates to a method for connecting a precious metal surface to a polymer and also to a layer composite produced therewith, comprising a porous precious metal layer and a polymer layer which has at least partially penetrated therein, in particular for applications on microelectronic and micromechanical semiconductor wafers and an microoptical applications and also for circuit substrates with organic layers.

The invention relates to a method for connecting a precious metal surface to a polymer and also to a layer composite produced therewith, comprising a porous precious metal layer and a polymer layer which has at least partially penetrated therein, in particular for applications on microelectronic and micromechanical semiconductor wafers and an microoptical applications and also for circuit substrates with organic layers.

In semiconductor technology there is a large number of cases in which a polymer is intended to be applied on a precious metal layer, for example a gold layer. One example is rewiring layers for changing the connection arrangement on an electronic semiconductor, comprising at least one organic dielectric layer and at least one metallic wiring layer. A further example is high frequency-suitable circuit substrates which are constructed from a layer composite of e.g. gold and an organic dielectric, such as for example polyimide, PBO, BCB or an epoxide. In another case, for example solder stop lacquers which are applied on gold-coated strip conductors, are used in order to delimit the wetting of the strip conductor by melted solder. In a further case, metal-polymer layers are used to produce stacks of semiconductor components and the electrical contacting thereof. The adhesion of polymer layers on precious metals, such as gold, is however critical. In the case of mechanical or thermomechanical stressing of the layer composite, the result, because of the low adhesion, is separation between the polymer and the precious metal layer. It has been attempted in the state of the art to increase the surface by roughening the latter and hence to improve the adhesion, or adhesives, e.g. Titan, have been used in order to improve the specific adhesion. The results are however either unsatisfactory or very complex to achieve.

The object underlying the invention, by way of example, but not by way of limitation, can be to produce a method and a surface structure with which the adhesive strength of polymer layers on gold surfaces is improved for semiconductor materials and circuit substrates in microelectronic, micromechanical or microoptical applications.

This object can be achieved according to the invention, by way of example, but not by way of limitation, by the features of the main claim.

As a result of the fact that the surface to be provided with polymer is formed by a sponge-like nanoporous gold layer which is achieved by deposition of a layer made of 20% to 40% gold and 60% to 80% silver onto a substrate and subsequent selective removal of the silver in order to produce the nanoporous gold layer, that the liquid polymer is applied on this sponge structure and is cured, very high adhesive strength of the polymer layer on the gold layer is achieved since the applied liquid polymer penetrates into the sponge-like structures and forms a three-dimensional interface with mechanical interlocking between the materials.

Advantageous developments and improvements are possible as a result of the measures indicated in the sub-claims.

Advantageously, a substrate used in electronics, microelectronics, micromechanics and/or microoptics is chosen as substrate, which substrate can be provided with electrically conducting, in particular structured metallisations. It can be a semiconductor wafer or a semiconductor chip produced therefrom or a single or multilayer circuit substrate.

The nanoporous gold layer can be applied on an already present metallic layer which can be the metallisation of the substrate, in particular a layer formed from gold.

The nanoporous gold layer can be deposited on wafers with microelectronic circuits or micromechanical elements or on a circuit substrate material, in particular on organic laminates, thin-film ceramics or thin-film glass.

The nanoporous gold layer or the combination of nanoporous gold layer and metallisation can be deposited on semiconductor materials in order to produce a rewiring structure or on a circuit substrate in order to produce a multilayer circuit.

The nanoporous gold layer or the combination of nanoporous gold layer and metallisation can serve to produce a stack arrangement comprising a plurality of microelectronic circuits or micromechanical or microoptical elements on a semiconductor base.

In an illustrative embodiment of the method according to the invention, the Ag/Au layer used in the intermediate step can be produced simply in a known deposition process, electrochemical deposition, deposition by means of electron beam evaporation or sputtering being able to be chosen. Advantageously, these can be in particular the electrochemical or galvanic process since the material consumption can be less and hence cost savings can be made. Also the silver can be removed by normal processes, for example by reverse electrolysis of the galvanic deposition process or by free etching.

The nanoporous sponge-like gold layer with a high continuous pore proportion and high freely accessible surface can be produced on any substrates. By varying the composition of the gold and of the silver, the density of the nanoporous gold layer can be varied.

Advantageously, the sponge-like gold layer can be pretreated in its surface, for example by reactive ion etching or hydrophilising, in order to improve the wetting.

Corresponding to the purposes of use, the nanoporous gold layer can be structured.

By providing a tempering process after production of the nanoporous gold layer, the size of its pores can be adjusted.

Advantageously, the deposition process of the Ag/Au layer can be improved by advance application of a plating base or an adhesive layer.

It is particularly advantageous that a vacuum is applied before, during or after application of the polymer in order to move the air out of the pores and to achieve deep penetration of the polymer into the sponge-like structure.

The polymer layer can be structured according to the configuration. Thus it can be expedient if the polymer remains merely where a porous surface is present.

The method according to an illustrative embodiment of the invention can be used in microsystem technology for the production of dielectric layers or as solder stop lacquer on gold-coated strip conductors or the like. The polymer can be configured also as a passivation layer on a wafer and, after separation, on a chip.

With the method according to an illustrative embodiment of the invention, a microelectronic, micromechanical or microoptical component with at least one precious metal surface connected to a polymer can be produced, the precious metal surface as gold layer being nanoporous and sponge-like and the polymer layer having penetrated at least partially into the sponge structure.

A circuit substrate made of organic material, ceramic or glass with at least one precious metal surface connected to a polymer can also be produced, the precious metal surface as gold layer being nanoporous and sponge-like and the polymer layer having penetrated at least partially into the sponge structure.

The method according to an illustrative embodiment of the invention is explained in more detail in the subsequent description using the accompanying drawing.

The single FIGURE shows schematically the layer construction with various steps of the method according to an illustrative embodiment of the invention for producing the nanoporous gold layer and subsequent application of the polymer.

Production of a nanoporous gold layer is described with reference to the FIGURE. First of all, corresponding to FIG. 1a, a plating base 2 in the form of a layer for adhesion strengthening, for example made of titanium, titanium/tungsten or chromium, is applied on the substrate and, thereupon, a starter layer made of gold, nickel, copper or platinum, this being able to take place by sputtering.

As further essential step corresponding to FIG. 1b, a galvanic deposition of a gold/silver alloy is undertaken, the alloy-forming metallic elements being present firstly in an electrolyte and the electrochemical deposition from the electrolyte takes place by applying a voltage. The composition of the gold/silver deposition is thereby in the range of 20% to 40% gold and 60% to 80% silver. As intermediate step corresponding to FIG. 1b, a gold/silver layer 3 is therefore situated on the starter layer 2.

Between FIG. 1b and the representation according to FIG. 1c in which a nanoporous gold layer 4 merging into the starter gold layer 2 is represented, the dissolving of the silver out of the layer 3 takes place, this selective dissolving or dealloying being able to be implemented in different ways. One possibility, in particular if electrochemical deposition is used, is reverse electrolysis of the principle of galvanic deposition in a suitable electrolyte, in which a voltage is applied to the electrodes, by means of which the silver is dissolved out but the gold is not affected. Another possibility is selective dealloying by external currentless etching of the silver, e.g. in nitric acid-containing solutions.

In the process for dissolving out the silver, a surface reaction takes place in the Ag/Au layer 3, during which reaction silver from the uppermost metal layer goes into solution as ion. The remaining Au atoms accumulate on the surface to form islands and protect the surface there selectively from further dissolution. Subsequently, silver is dissolved out of the next metal layer which is not covered by a gold island. By means of repeated accumulation of the moveable Au atoms from the layer, a 3D sponge layer with nanoscale pores grows slowly. The sponge-like nanoporous layer is designated in FIG. 1c with 4.

The deposition of the Ag/Au layer 3 was described further back as the electrochemical process, however it can also be produced by vapour deposition, e.g. electron beam evaporation or sputtering. Similarly to FIG. 1a, an adhesive layer with materials generally used in thin-film technology is applied in advance. In the case of sputtering or cathodic sputtering, the silver and the gold can be sputtered alternately or in parallel, the multilayers diffusing one into the other by tempering.

In the description according to FIGS. 1a-1d, only the main steps for producing the nanoporous gold layer 4 have been explained. Of course, further method steps can be interposed. Thus, between the representations of FIGS. 1a and 1b, for example a photosensitive lacquer is applied and, corresponding to the specifications of the layer configuration, is structured lithographically. The thus produced lacquer mask can be removed again, according to the method course, before and after the selective dealloying of the silver. If the plating base 2 is intended to be etched away, a second lacquer mask is structured for protection of the nanoporous layer 4 and subsequently the plating base is etched. After removing this second lacquer mask, possibly further structurings of the nanoporous or sponge-like gold layer 4 can be undertaken.

Between the layer construction according to FIG. 1c and according to that of FIG. 1d which shows a polymer layer 5 on and in the sponge-like nanoporous gold layer 4, the surface of the sponge-like gold layer 4 is pre-treated, e.g. by reactive ion etching or by hydrophilising in order to improve wetting and a liquid polymer is applied, which is for example a benzocyclobutene prepolymer or a polyimide. In order that the liquid polymer penetrates better into the sponge-like structure, the arrangement is placed under vacuum, as a result of which penetration of the liquid polymer into the pores is assisted.

If a photosensitive polymer layer 5 is intended to be structured, it is exposed with a mask and developed. Finally, the polymer layer is polymerised, crosslinked and cured.

What is claimed is:

1. A method for connecting a precious metal surface to a polymer, the method comprising:
   depositing a layer made of 20% to 40% gold and 60% to 80% silver onto a substrate using electrochemical deposition;
   selectively removing the silver in order to form a nanoporous gold layer;
   applying a liquid polymer onto the previously formed nanoporous gold layer, wherein the applied liquid polymer penetrates into the porous gold layer and forms a three-dimensional interface with mechanical interlocking between the polymer and the nanoporous gold layer; and
   curing of the liquid polymer to form a polymer layer,
   wherein the layer of gold and silver is deposited on a substrate of a type used in electronics, microelectronics, micromechanics, and/or microoptics.

2. The method according to claim 1, wherein the substrate is provided with structured electrical conductors and is a semiconductor wafer, or a semiconductor chip produced therefrom, and/or a single or multilayer circuit substrate.

3. The method according to claim 1, wherein before forming the nanoporous gold layer, a metallic starter layer is deposited on the substrate.

4. The method according to claim 1, comprising forming the nanoporous gold layer on the substrate including a wafer including a microelectronic circuit or a micromechanical element and/or on the substrate including a circuit substrate material that includes an organic laminate, a ceramic, and/or a glass material.

5. The method according to claim 1, comprising forming the nanoporous gold layer on the substrate including a semiconductor material to produce a rewiring structure and/or on the substrate including a circuit substrate to produce a multilayer circuit.

6. The method according to claim 1, comprising forming the nanoporous gold layer on the substrate to produce a stack arrangement comprising a plurality of microelectronic circuits and/or micromechanical and/or microoptical elements on a semiconductor base of the substrate.

7. The method according to claim 1, comprising forming the polymer using BCB (benzocyclobutene), polyimide, PBO (polyoxadiazobenzimidazole), and/or an epoxide.

8. The method according to claim 1, wherein, before the depositing the layer made of gold and silver, applying on the substrate a plating base with adhesion strengthening.

9. The method according to claim 1, comprising applying an adhesive layer on the substrate before the depositing the layer made of gold and silver.

10. The method according to claim 1, wherein before the depositing the layer made of gold and silver, a lithographically structured plating base or adhesive layer is applied on the substrate.

11. The method according to claim 1, wherein the selectively removing the silver includes using reverse electrolysis of galvanic deposition of the layer made of gold and silver.

12. The method according to claim 1, wherein the selectively removing the silver includes etching of the silver.

13. The method according to claim 1, comprising applying a photoresist layer onto the substrate and structuring the photoresist layer to form a lacquer mask and, before or after the selectively removing the silver, removing the lacquer mask used for the depositing the layer made of gold and silver for structuring the layer made of gold and silver.

14. The method according to claim 1, comprising adjusting a pore size of the nanoporous gold layer by tempering.

15. The method according to claim 1, comprising structuring the nanoporous gold layer.

16. The method according to claim 1, comprising treating the nanoporous gold layer to provide better wetting, the treating including reactive ion etching, and/or hydrophilizing.

17. The method according to claim 1, comprising applying the polymer in liquid form.

18. The method according to claim 1, wherein applying the liquid polymer comprises vapor depositing the polymer.

19. The method according to claim 1, comprising placing the polymer in liquid state under vacuum so as to provide better penetration into the nanoporous gold layer.

20. The method according to claim 1, comprising structuring the polymer layer.

21. The method according to claim 1, comprising polymerizing and crosslinking the polymer layer after application and penetration into the nanoporous gold layer.

22. The method according to claim 1, comprising configuring the polymer layer as an organic dielectric.

23. The method according to claim 1, comprising configuring the polymer layer as a solder-stop lacquer.

24. The method according to claim 1, wherein the polymer is configured as a passivation layer on the substrate including a wafer and, after separation of the wafer, on a chip.

25. The method of claim 1, wherein the substrate is a microelectronic, micromechanical, and/or microoptical component and the nanoporous gold layer is connected to the polymer layer, wherein a portion of the liquid polymer having penetrated into the nanoporous gold layer.

26. The method of claim 1, wherein the substrates is a circuit substrate made of organic material, ceramic, and/or glass with the nanoporous gold layer connected to the polymer layer, wherein a portion of the liquid polymer having penetrated into the nanoporous gold layer.

27. A method for connecting a precious metal surface to a polymer, the method comprising:
  applying on a substrate a plating base with adhesion strengthening;
  applying a photosensitive layer and lithographically structuring the photosensitive layer to produce a mask;
  depositing a metallic starter layer on the substrate;
  depositing a layer made of 20% to 40% gold and 60% to 80% silver onto the substrate using the mask, the substrate including at least one of a substrate including at least one of an organic laminate, a ceramic, a glass, or of a type used in electronics, microelectronics, microoptics, of semiconductors, the depositing including using at least one of galvanic depositing, electrochemical depositing, vapor deposition, and/or sputtering;
  removing the mask used for the depositing;
  selectively removing the silver in order to form a nanoporous gold layer, the selectively removing including at least one of etching or dealloying the silver;
  adjusting a pore size of the nanoporous gold layer by tempering;
  treating the nanoporous gold layer to provide better wetting, the treating including at least one of reactive ion etching and/or hydrophilizing;
  applying a liquid polymer, including at least one of BCB, polyimide, PBO, and/or an epoxide; and
  curing of the liquid polymer to form a polymer layer, the curing including crosslinking the polymer layer after application and penetration into the nanoporous gold layer,
  wherein the substrate is at least one of a microelectronic, micromechanical, and/or microoptical component, and/or a circuit substrate made of organic material, ceramic, and/or glass, the nanoporous gold layer connected to the polymer layer, the nanoporous gold layer having pores and the liquid polymer having penetrated into the pores.

28. A method for connecting a precious metal surface to a polymer, the method comprising:
  depositing a plating layer onto a substrate,
  applying a photoresist layer onto the plating layer and structuring the photoresist layer to form a lacquer mask,
  depositing a layer made of 20% to 40% gold and 60% to 80% silver using electrochemical deposition onto the masked plating layer and the substrate to form a structured layer made of gold and silver;
  selectively removing the silver in order to form a nanoporous gold layer;
  before or after the selectively removing the silver, removing the lacquer mask used for the depositing the layer of gold and silver,
  removing the plating base from areas not covered by the nanoporous gold layer,
  applying a liquid polymer onto the previously formed nanoporous gold layer, wherein the applied liquid polymer penetrates into the porous gold layer and forms a three-dimensional interface with mechanical interlocking between the polymer and the nanoporous gold layer; and
  curing of the liquid polymer to form a polymer layer,
  wherein the plating layer is deposited onto a substrate of a type used in electronics, microelectronics, micromechanics, and/or microoptics.

* * * * *